(12) United States Patent
Sun et al.

(10) Patent No.: US 7,479,304 B2
(45) Date of Patent: Jan. 20, 2009

(54) GAS DISTRIBUTION PLATE FABRICATED FROM A SOLID YTTRIUM OXIDE-COMPRISING SUBSTRATE

(75) Inventors: Jennifer Y. Sun, Sunnyvale, CA (US); Senh Thach, Union City, CA (US); James Dempster, Sunnyvale, CA (US); Li Xu, San Jose, CA (US); Thanh N. Pham, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 282 days.

(21) Appl. No.: 10/918,232

(22) Filed: Aug. 13, 2004

(65) Prior Publication Data

US 2005/0056218 A1   Mar. 17, 2005

Related U.S. Application Data

(63) Continuation-in-part of application No. 10/898,113, filed on Jul. 22, 2004, which is a continuation-in-part of application No. 10/075,967, filed on Feb. 14, 2002, now Pat. No. 6,776,873.

(51) Int. Cl.
*C23C 16/00* (2006.01)
*B05D 3/12* (2006.01)

(52) U.S. Cl. ..................................... 427/289
(58) Field of Classification Search ........................ None
See application file for complete search history.

(56) References Cited

U.S. PATENT DOCUMENTS

| | | | | |
|---|---|---|---|---|
| 5,488,925 A | | 2/1996 | Kumada | 118/715 |
| 5,798,016 A | | 8/1998 | Oehrlein et al. | 156/345.37 |
| 5,888,884 A | * | 3/1999 | Wojnarowski | 438/462 |
| 5,993,594 A | * | 11/1999 | Wicker et al. | 156/345.34 |
| 6,123,791 A | | 9/2000 | Han et al. | 156/1 |
| 6,170,429 B1 | | 1/2001 | Schoepp et al. | 118/723 R |
| 6,237,528 B1 | * | 5/2001 | Szapucki et al. | 118/723 E |
| 6,352,611 B1 | | 3/2002 | Han et al. | 156/345 |
| 6,399,499 B1 | * | 6/2002 | Lee | 438/692 |
| 6,521,046 B2 | | 2/2003 | Tanaka et al. | 118/715 |
| 6,776,873 B1 | * | 8/2004 | Sun et al. | 156/345.41 |

(Continued)

FOREIGN PATENT DOCUMENTS

DE   19955134   5/2001

(Continued)

*Primary Examiner*—Allan Olsen
(74) *Attorney, Agent, or Firm*—Law Office of Shirley L. Church (57) ABSTRACT

Disclosed herein is a gas distribution plate for use in a gas distribution assembly for a processing chamber, where the gas distribution plate is fabricated from a solid yttrium oxide-comprising substrate, which may also include aluminum oxide. The gas distribution plate includes a plurality of through-holes, which are typically crescent-shaped. Through-holes which have been formed in the solid yttrium oxide-comprising substrate by ultrasonic drilling perform particularly well. The solid yttrium oxide-comprising substrate typically comprises at least 99.9% yttrium oxide, and has a density of at least 4.92 g/cm³, a water absorbency of about 0.02% or less, and an average grain size within the range of about 10 μm to about 25 μm. Also disclosed herein are methods for fabricating and cleaning the yttrium oxide-comprising gas distribution plate.

16 Claims, 6 Drawing Sheets

U.S. PATENT DOCUMENTS

| | | | |
|---|---|---|---|
| 6,916,559 B2 * | 7/2005 | Murakawa et al. | 428/697 |
| 6,983,892 B2 * | 1/2006 | Noorbakhsh et al. | 239/67 |
| 2001/0003271 A1 | 6/2001 | Otsuki et al. | 118/723.001 |
| 2002/0086118 A1 * | 7/2002 | Chang et al. | 428/334 |
| 2002/0110698 A1 | 8/2002 | Singh | 428/472 |
| 2002/0127853 A1 * | 9/2002 | Hubacek et al. | 438/689 |
| 2003/0029563 A1 * | 2/2003 | Kaushal et al. | 156/345.1 |
| 2003/0127049 A1 * | 7/2003 | Han et al. | 118/715 |

FOREIGN PATENT DOCUMENTS

| | | |
|---|---|---|
| EP | 0293198 | 11/1988 |
| JP | 03-287797 | 12/1991 |
| JP | 2001023908 | 1/2001 |

* cited by examiner

GAS DISTRIBUTION PLATE FABRICATED FROM A SOLID YTTRIUM OXIDE-COMPRISING SUBSTRATE

The present application is a continuation-in-part of U.S. application Ser. No. 10/898,113, filed Jul. 22, 2004, and entitled "Clean, Dense, Yttrium Oxide Coating Protecting Semiconductor Apparatus", which is presently pending, and which is a continuation-in-part of U.S. application Ser. No. 10/075,967, filed Feb. 14, 2002 now U.S. Pat. No. 6,776,873.

BACKGROUND OF THE INVENTION

1. Field of the Invention

The present invention relates to a gas distribution plate for use in a gas distribution assembly in a processing chamber, and to methods of fabricating the gas distribution plate.

2. Description of the Background Art

Corrosion (including erosion) resistance is a critical property for apparatus components used in processing chambers where corrosive environments are present, such as in plasma cleaning and etch processes, and in plasma-enhanced chemical vapor deposition processes. This is especially true where high-energy plasma is present and combined with chemical reactivity to act upon the surface of components present in the environment. It is also an important property when corrosive gases alone are in contact with processing apparatus component surfaces.

Process chambers and component apparatus present within processing chambers which are used in the fabrication of electronic devices and micro-electro-mechanical structures (MEMS) are frequently constructed from aluminum and aluminum alloys. Surfaces of a process chamber and component apparatus present within the chamber are frequently anodized to provide a degree of protection from the corrosive environment. However, the integrity of the anodization layer may be deteriorated by impurities in the aluminum or aluminum alloy, so that corrosion begins to occur early, shortening the life span of the protective coating. Ceramic coatings of various compositions have been used in place of the aluminum oxide layer mentioned above, and have been used over the surface of the anodized layer to improve the protection of the underlying aluminum-based materials. However, the protective layer deteriorates over time and eventually leaves the aluminum alloy subject to attack, even though the life span of the protective layer is extended over that of anodized aluminum.

Yttrium oxide is a ceramic material which has shown considerable promise in the protection of aluminum and aluminum alloy surfaces which are exposed to fluorine-containing plasmas of the kind used in the fabrication of semiconductor devices. In U.S. application Ser. No. 10/075,967 ("the '967 application"), the grandparent application of the present continuation-in part application, which has been allowed, it is disclosed that a yttrium oxide coating applied over an anodized surface of a high purity aluminum alloy process chamber surface or process component surface produces excellent corrosion protection. In particular, the '967 application pertains to a processing chamber component resistant to a plasma including fluorine and oxygen species. The processing chamber component typically comprises: a high purity aluminum substrate, where particulates formed from mobile impurities have a particle size distribution such that no more than 0.2% of the particles are larger than 20 µm, with no particles being larger than 50 µm; an anodized coating on a surface of the high purity aluminum substrate; and a protective coating comprising yttrium oxide overlying the anodized coating. The protective coating may include aluminum oxide up to about 10% by weight, and typically comprises 99.95% by weight or greater yttrium oxide. The protective coating is coating typically applied using a method such as spray coating, chemical vapor deposition, or physical vapor deposition.

U.S. Pat. No. 5,798,016, to Oehrlein et al., issued Aug. 25, 1998, describes a method and apparatus for etching semiconductor devices where undesirable deposition of films on internal surfaces of the apparatus are prevented using a heatable liner or process chamber wall. The heated liner or chamber wall may be constructed from a "wide variety of materials, for example, ceramics, aluminum, steel, and/or quartz. Aluminum is the preferred material because it is easy to machine." However, since aluminum is reactive with a number of plasmas, it is recommended that "aluminum oxide or a coating thereof be disposed on the liner or chamber walls", because aluminum oxide tends to be chemically inert. In addition to the materials used to construct the liner and/or chamber walls, a protective coating may be applied to the surfaces of the liner and/or chamber walls. Examples which are given include $Al_2O_3$, $Sc_2O_3$, or $Y_2O_3$.

U.S. Patent Application Publication No. US 2001/0003271A1, of Otsuki, published Jun. 14, 2001, describes a processing apparatus for semiconductor wafers, where the process may include a plasma, in which a film of $Al_2O_3$, or $Al_2O_3$ and $Y_2O_3$, is formed on an inner wall surface of the chamber and on those exposed surfaces of the members within the chamber which require a high corrosion resistance and insulating property. An example is given of a processing chamber where a base material of the chamber may be a ceramic material ($Al_2O_3$, $SiO_2$, AlN, etc.), aluminum, or stainless steel, metal or metal alloy, which has a sprayed film over the base material. The sprayed film may contain an oxide of Y, Sc, La, Ce, Eu, Dy, or the like, or fluoride of one of these metals. The film may be made of a compound of a III-a element of the periodic table, such as $Y_2O_3$. The film may substantially comprise $Al_{2O3}$ and $Y_2O_3$. A sprayed film of yttrium-aluminum-garnet (YAG) is also mentioned. The sprayed film thickness is said to range from 50 µm to 300 µm.

U.S. Pat. No. 6,352,611, to Han et al., issued Mar. 5, 2002, describes a dielectric window of a reactor chamber where substrates are processed in a plasma of a processing gas. A ceramic composition of matter used to produce a process kit and a dielectric window preferably contains a ceramic compound (e.g., $Al_2O_3$) and an oxide of a Group IIIB metal (e.g., $Y_2O_3$). The ceramic compound may be selected from silicon carbide, silicon nitride, boron carbide, boron nitride, aluminum nitride, aluminum oxide, and mixtures thereof; however, aluminum oxide is said to be available in a pure form which does not outgas. The Group IIIB metal may be selected from the group consisting of scandium, yttrium, the cerium subgroup, and the yttrium subgroup; however, yttrium is preferred, with the oxide being yttrium oxide. The preferred process for forming or producing the dielectric member is by thermal processing of a powdered raw mixture comprising the ceramic compound, the oxide of a Group IIIB metal, a suitable additive agent, and a suitable binder agent.

U.S. Pat. application Ser. No. 10/898.113, filed Jul. 22, 2004, and entitled "Clean, Dense, Yttrium Oxide Coating Protecting Semiconductor Apparatus", which is the parent application of the present continuation-in-part application, discloses a protective coating for a semiconductor processing apparatus component comprising aluminum or an aluminum alloy, where the coating includes a material selected from, for example, but not limited to: yttrium-aluminum-garnet (YAG); an oxide of an element selected from the group consisting of Y, Sc, La, Ce, Eu, and Dy; a fluoride of an element selected from the group consisting of Y, Sc, La, Ce, Eu, and Dy; and combination thereof. The coating is applied to the substrate surface by thermal/flame spraying, plasma spraying, sputtering, or chemical vapor deposition (CVD). The coating is placed in compression by applying the coating at a substrate surface temperature of at least about 150-200° C. The disclosures of U.S. application Ser. Nos. 10/075,967 and 10/898,113 are hereby incorporated herein by reference in their entirety.

The kinds of protective coatings described above have been used to protect gas distribution plate exposed surfaces for gas distribution assemblies used in semiconductor and MEMS processing apparatus. However, due to the concentration of reactive species which are present at the surface of the gas distribution plate, the lifetime of the gas distribution plate has typically been limited, from about 8 processing days to about 80 processing days. Thus, there is a need in the device and MEMS fabrication industry for a longer lasting gas distribution plate.

SUMMARY OF THE INVENTION

We have discovered that it is possible to improve the lifetime of a gas distribution plate for use in a gas distribution assembly. The gas distribution plate, which includes a plurality of through-holes (which are typically crescent-shaped), is constructed from a solid yttrium oxide-comprising substrate which is treated to have particular properties.

The yttrium oxide-comprising substrate typically comprises at least 99.9% by volume yttrium oxide and has a density of at least 4.92 g/cm$^3$ and a water absorbency of about 0.02% or less. The average crystalline grain size of the yttrium oxide is within a range of about 10 μm to about 25 μm. The yttrium oxide-comprising substrate includes impurities at equal to or less than the following maximum concentrations: 90 ppm Al; 10 ppm Ca; 5 ppm Cr; 5 ppm Cu; 10 ppm Fe; 5 ppm K; 5 ppm Mg; 5 ppm Na; 5 ppm Ni; 120 ppm Si; and 5 ppm Ti. A yttrium oxide-comprising substrate of this general composition may also include up to about 10% by volume of aluminum oxide.

Through-holes can be formed in the solid yttrium oxide-comprising substrate using laser drilling or ultrasonic drilling, for example and not by way of limitation. Laser drilling may be used to form round through-holes. Ultrasonic drilling provides excellent results when drilling through-holes having more complicated shapes, such as crescent shapes, which are used to prevent arcing at the surface of the gas distribution plate when a plasma is present. The ultrasonic drilling can be carried out from either side of the yttrium oxide-comprising substrate.

When ultrasonic drilling a surface of a bulk yttrium oxide-comprising substrate, the best results are achieved when a thin sacrificial layer of a flexible, polymeric material is applied or when a more rigid material having a similar thermal coefficient of linear expansion to that of yttrium oxide is applied over the yttrium oxide surface. The sacrificial layer is typically applied to have a thickness within the range of about 4 mils to about 6 mils.

The yttrium oxide-comprising substrate is typically cleaned after ultrasonic drilling. The cleaning process removes trace metal impurities which may cause problems during substrate processing, and also removes loose particles from the surface of the yttrium oxide-comprising substrate which are likely to become contaminating particulates during the processing of substrates.

The cleaning process removes undesired contaminants and deposition process by-products without affecting the performance capability of the yttrium oxide-comprising substrate. Exposed surfaces of the yttrium oxide-comprising substrate are first saturated with an inert solvent. Typically, the yttrium oxide-comprising substrate is immersed in a deionized water ultrasonic bath at a frequency of about 40 kHz (for example, and not by way of limitation) for a period of about 5 minutes to about 30 minutes. Subsequently, a chemically active solvent is applied to remove contaminants from the yttrium oxide surface. For example, the surface of the yttrium oxide-comprising substrate may be treated with a dilute acid solution for a period of about 3 minutes to about 15 minutes. One advantageous dilute acid solution comprises about 0.1 to about 5 volume % HF (more typically, about 1 to about 5 volume %); about 1 to about 15 volume % HNO$_3$ (more typically, about 5 to about 15 volume %); and about 80 to about 99 volume % deionized water. After such treatment, the yttrium oxide-comprising substrate is then rinsed with deionized water, followed by immersion in a deionized water ultrasonic bath at a frequency of about 40 kHz (for example, and not by way of limitation) for a period of about 30 minutes to about 2 hours (typically, for a period of about 40 minutes to about 1 hour).

In addition to removing impurities and contaminants from the yttrium oxide surface, the step of treating the yttrium oxide-comprising substrate with the dilute HF solution (for example, and without limitation, by soaking the substrate in or wiping the substrate with the dilute HF solution) provides fluorination (i.e. self-passivation) to the yttrium oxide surface. Fluorination of the yttrium oxide surface results in a robust, stable surface which is inert to reactive plasmas. Fluorination of the yttrium oxide surface can also be obtained by exposing the coated surface to a plasma containing fluorine species. Such a plasma may be generated from, for example and not by way of limitation, a plasma source gas such as $CF_4$ or $CHF_3/CF_4$. Typically, the plasma density is about $1\times10^9$ e$^-$/cm$^{3,}$ under general processing conditions known in the art, which provide a yttrium oxide surface which is at least partially fluorinated.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

Disclosed herein is a gas distribution plate for use in a gas distribution assembly for a processing chamber, where the gas distribution plate has been fabricated from a solid yttrium oxide substrate.

Figure 1:
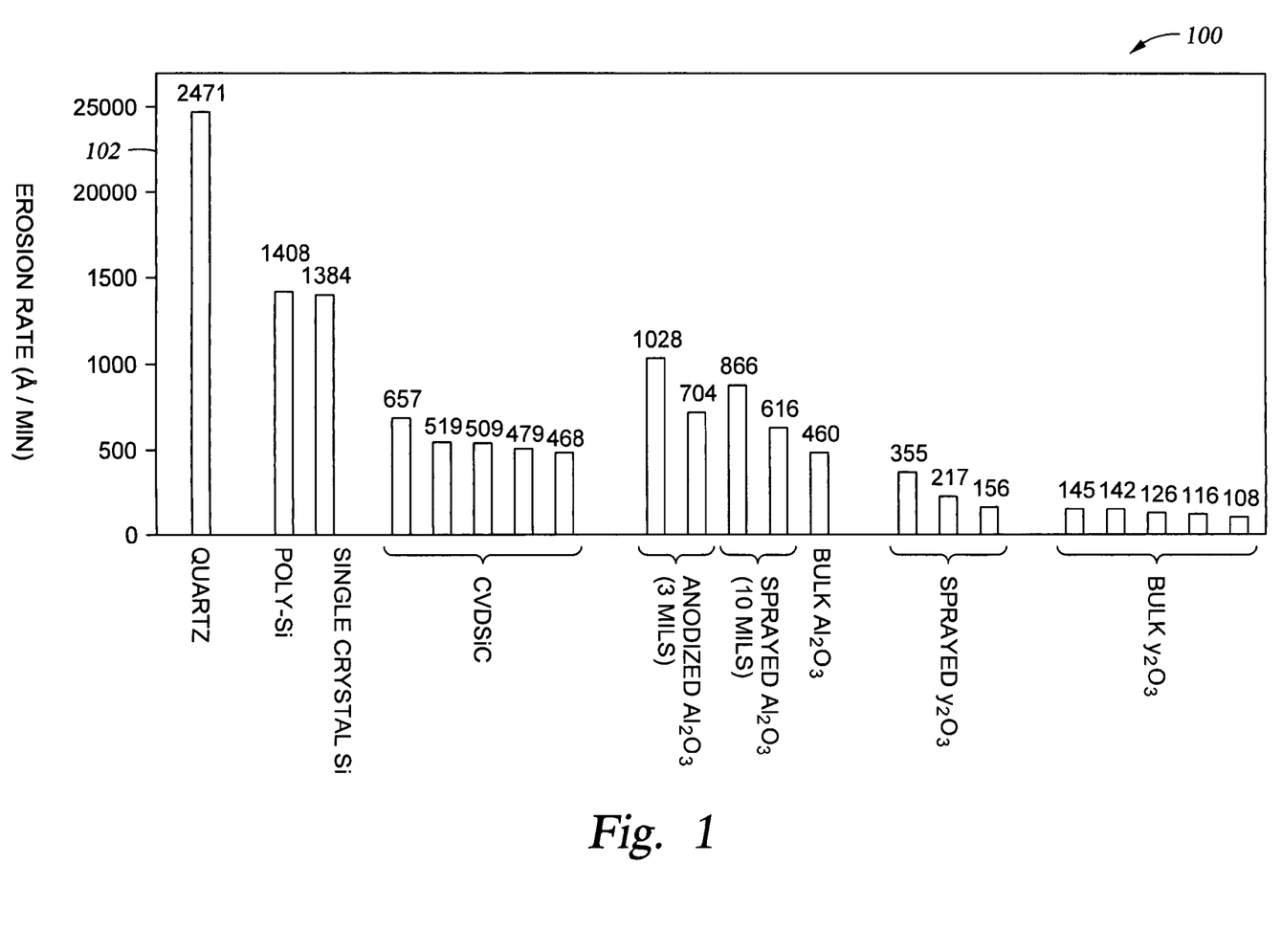
FIG. 1 is a graph 100 which illustrates the relative erosion rates 102 for various materials upon exposure of the materials to a $CHF_3/CF_4$ plasma

Bulk yttrium oxide has been shown to have excellent corrosion resistance upon exposure to fluorine plasma and other corrosive plasmas which are typically used in semiconductor manufacturing processes (such as etch processes and chemical vapor deposition processes). FIG. 1 is a graph 100 which illustrates the relative erosion rates 102 for various materials upon exposure of the materials to a $CHF_3/CF_4$ plasma. The materials include quartz; polysilicon ("Poly-Si"); single crystal silicon; CVD-deposited silicon carbide ("CVD SiC"); anodized $Al_2O_3$, having a thickness of 3 mils; spray-coated $Al_2O_3$, having a thickness of 10 mils; bulk $Al_2O_3$; spray-coated $Y_2O_3$; and bulk $Y_2O_3$. The five bulk $Y_2O_3$ samples which are illustrated represent solid yttrium oxide-comprising substrates provided by different suppliers. These substrates comply with specifications set by applicants.

As shown in FIG. 1, after exposure to the $CHF_3/CF_4$ plasma, the average erosion rate of bulk $Y_2O_3$ is significantly lower than the average erosion rates of the other materials tested. With the exception of one plasma-sprayed yttrium oxide having an erosion rate of 156 Å/min, which was prepared by the method described in U.S. Pat. application Ser. No. 10/898,113 assigned to assignee of the present invention), none of the other corrosion-resistant materials perform comparably with the bulk $Y_2O_3$ samples.

Table One, below, presents process chemistry and conditions which were used to perform the erosion rate tests in an Applied Materials' PRODUCER™ etch chamber (available from Applied Materials, Inc., Santa Clara, Calif.).

TABLE ONE

Process Conditions for Erosion Rate Test

| Step: | ARC Open | Main Etch | Overetch |
|---|---|---|---|
| $CHF_3$ (sccm) | 200 | 125 | 75 |
| $CF_4$ (sccm) | 120 | 125 | 0 |
| $O_2$ (sccm) | 15 | 32 | 0 |
| Ar (sccm) | 0 | 0 | 200 |
| He coolant applied to substrate (feed ° C.) | 8 | 8 | 10 |
| He pressure* (Torr) | 12 | 12 | 10 |
| Chamber Pressure (mTorr) | 35 | 50 | 50 |
| Substrate Bias (W) | 300 | 1250 | 1000 |
| Cathode Temperature (° C.) | 15 | 15 | 15 |
| Wall Temperature (° C.) | 15 | 15 | 15 |
| Time (hours) | 8.7 | 8.7 | 2.6 |

*Pressure of helium beneath substrate which is allowed to "leak" around the edges of the substrate to provide a flow of cooling fluid over the surface of the substrate.

The process conditions for the erosion rate test provided in Table One were selected in order to simulate the process conditions to which processing chamber surfaces are exposed over time during etch processing of actual semiconductor substrates (such as silicon wafers having various material layers deposited thereon).

Specific chemical and physical requirements for bulk yttrium oxide of one exemplary embodiment used in the gas distribution plate of the invention are provided in Table Two, below.

TABLE TWO

Chemical and Physical Requirements for Bulk Yttrium Oxide Embodiment

Properties:

| | | |
|---|---|---|
| Chemical | Purity | $\geq$99.9% |
| Physical | Density | $\geq$4.92 g/cm$^3$ |
| | Water Absorption | $\leq$0.02% |
| | Average Grain Size | 10-25 μm |

Impurity specifications for bulk yttrium oxide of one exemplary embodiment used in the gas distribution plate of the invention are provided in Table Three, below.

TABLE THREE

Impurity Specifications for Bulk Yttrium Oxide Embodiment

| Element | Parts Per Million (max.) |
|---|---|
| Al | 90 |
| Ca | 10 |
| Cr | 5 |
| Cu | 5 |
| Fe | 10 |
| K | 5 |
| Mg | 5 |
| Na | 5 |
| Ni | 5 |
| Si | 120 |
| Ti | 5 |

Typical mechanical, thermal, and electrical properties of bulk yttrium oxide of one exemplary embodiment used in the gas distribution plate of the invention are provided in Table Four below.

TABLE FOUR

Material Properties of Bulk Yttrium Oxide Embodiment

| | Properties: | |
|---|---|---|
| Mechanical | Flexural Strength | 100-150 MPa |
| | Modulus of Elasticity | 140-170 GPa |
| | Hardness (Vicker 5 Kgf) | 5.7 GPa |
| | Fracture Toughness | 1.0-1.3 MPa/m$^{1/2}$ |
| Thermal | Thermal Expansion Coefficient (20-900° C.) | $7.2 \times 10^{-6}$/K |
| | Thermal Conductivity (20° C.) | 13.7 W/mK |
| | Thermal Shock Resistance (Tc) | 130-200° C. |
| Electrical | Volumetric Resistivity (20-100° C.) | $1 \times 10^{12}$-$1 \times 10^{13}$ Ω/cm |
| | Dielectric Constant (13.56 MHz) | 12.3-13.0 ϵ |
| | tan δ | $\leq 0.002 \times 10^{-4}$ |
| | Color (Mansel brighness) | 7.8-9.7 N |

Through-holes can be formed in the solid yttrium oxide-comprising substrate using laser drilling or ultrasonic drilling, for example and not by way of limitation. Laser drilling may be used to form round through-holes. Ultrasonic drilling provides excellent results when drilling through-holes having more complicated shapes, such as crescent shapes. The ultrasonic drilling can be carried out from either side of the yttrium oxide-comprising substrate.

When ultrasonic drilling a surface of a bulk yttrium oxide-comprising substrate, the best results are achieved when a thin sacrificial layer of a flexible, polymeric material (such as molten beeswax, for example and not by way of limitation) is applied or when a more rigid material having a similar thermal coefficient of linear expansion to that of yttrium oxide is applied over the surface of the yttrium oxide-comprising substrate. The sacrificial layer is typically applied to have a thickness within the range of about 4 mils to about 6 mils.

The ultrasonic drilling is typically performed by sandwiching the solid yttrium oxide-comprising substrate between two carrier plates. One surface of each carrier plate has typically been coated with molten beeswax, for example and not by way of limitation. The substrate is placed between the two beeswax-coated carrier plates, with the beeswax-coated surfaces facing the top and bottom surfaces of the yttrium oxide-comprising substrate. The substrate/carrier plate assembly is then cooled to room temperature. The top carrier plate has a pattern of openings formed in it for ultrasonic drilling. The pattern of openings in the top carrier plate becomes the pattern of through-holes in the yttrium oxide-comprising substrate during the ultrasonic drilling process. An ultrasonic drilling head is coupled to the top carrier plate. A slurry (such as a water-based fine alumina powder, for example and not by way of limitation) flows from the drilling head into openings in the top carrier plate. After ultrasonic drilling, the drilled yttrium oxide-comprising substrate is cleaned in a deionized water ultrasonic bath, as described below.

Figure 2A:
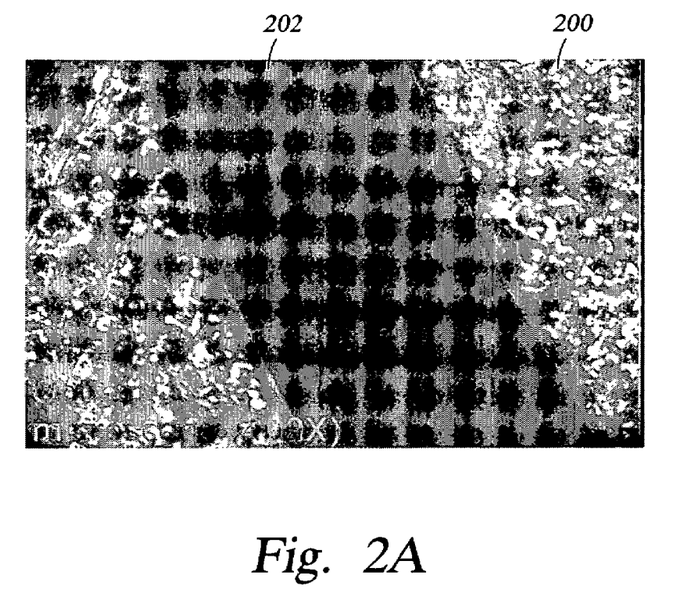
FIG. 2A shows an illustration of an optical microscope photo top view of a portion of a crescent-shaped through-hole 202 which has been ultrasonically drilled in a solid $Y_2O_3$ substrate 200, at a magnification of 400×.
Figure 2B:
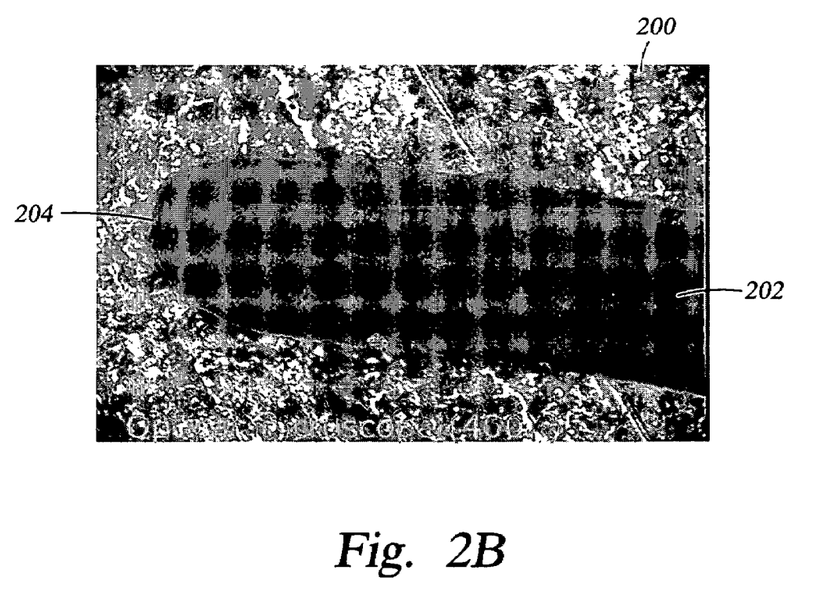
FIG. 2B shows an illustration of an optical microscope photo top view of an end portion 204 of a crescent-shaped through-hole 202 which has been ultrasonically drilled in a solid $Y_2O_3$ substrate 200, at a magnification of 400×.

FIG. 2A shows an illustration of an optical microscope top view of a a portion of a crescent-shaped hole 202 which has been ultrasonically drilled in a solid $Y_2O_3$ substrate 200, at a magnification of 400×. FIG. 2B shows an illustration of an optical microscope top view of an end portion 204 of the crescent-shaped through-hole 202 shown in FIG. 2A. The edges of the through-holes 202 shown in FIGS. 2A and 2B are smooth, and show no evidence of breaking or chipping.

The yttrium oxide-comprising substrate is typically cleaned after ultrasonic drilling. The cleaning process removes trace metal impurities which may cause problems during semiconductor processing, and also removes loose particles from the surface of the yttrium oxide-comprising substrate which are likely to become contaminating particulates during the processing of semiconductor substrates.

The cleaning process removes undesired contaminants and deposition process by-products without affecting the performance capability of the yttrium oxide-comprising substrate. Exposed surfaces of the yttrium oxide-comprising substrate are first saturated with an inert solvent. Subsequently, a chemically active solvent is applied to remove contaminants from the yttrium oxide surface.

In the cleaning process, a yttrium oxide-comprising substrate is typically immersed in a deionized water ultrasonic bath ("first DI bath") at a frequency of about 40 kHz (for example, and not by way of limitation) for a period of about 5 minutes to about 30 minutes. This presaturates the surface of the substrate with water and removes loose particles from the substrate surface prior to chemical cleaning. The yttrium oxide-comprising substrate is then chemically cleaned to remove trace metals by soaking or wiping the yttrium oxide surface with a soft wipe which has been wetted with a dilute acid solution for a period of about 3 minutes to about 15 minutes. One advantageous dilute acid solution comprises about 0.1 to about 5 volume % HF (more typically, about 1 to about 5 volume %); about 1 to about 15 volume % $HNO_3$ (more typically, about 5 to about 15 volume %); and about 80 to about 99 volume % deionized water.

After wiping the yttrium oxide-comprising substrate with the dilute acid solution, as described above, the yttrium oxide-comprising substrate is then rinsed with deionized water, followed by immersion in a deionized water ultrasonic bath ("second DI bath") at a frequency of about 40 kHz (for example, and not by way of limitation) for a period of about 30 minutes to about 2 hours (typically, for about 40 minutes to about 1 hour). Following removal from the second DI bath, the yttrium oxide-comprising substrate is rinsed with deionized water again, then blow-dried with $N_2$ and lamp/oven baked at a temperature of about 50° C. to about 70° C. for a period of up to 2 hours. The yttrium oxide-comprising substrate is typically further cleaned using $CO_2$ snow (very fine dry ice), which causes any remaining particles to freeze, crumble, and detach from the yttrium oxide surface.

Table Five, below, presents the results of an analysis of the number of 0.2 μm diameter or larger particles per square centimeter remaining on a yttrium oxide-comprising substrate surface after cleaning according to the multiple step cleaning process described above, with second DI bath times of 10, 40, and 70 minutes.

TABLE FIVE

Particles Remaining on Yttrium Oxide Substrate Surface After Cleaning, With Varying Second DI Ultrasonic Bath Times

| Second DI Bath (minutes) | Number of ≧0.2 μm particles/cm$^2$ |
|---|---|
| 10 | 760,000 |
| 40 | 240,000 |
| 70 | 230,000 |

After 40 minutes of immersion in the second DI bath, the number of particles present on the substrate surface has been reduced to approximately one-third of the number of particles remaining after 10 minutes immersion in the second DI bath.

A further improvement is observed after an increase in time to 70 minutes, but the improvement is minor by comparison.

Table Six, below, presents the results of an analysis of the surface concentration ($\times 10^{10}$ atoms/cm$^2$) of mobile elements on a yttrium oxide-comprising substrate surface after a standard cleaning process and after cleaning according to the multiple step cleaning process described above. The standard cleaning process is a single-step process in which a substrate is immersed in a deionized water ultrasonic bath at a frequency of about 40 kHz for a period of up to 1 hour (typically, about 40-50 minutes).

TABLE SIX

Surface Concentration of Mobile Elements on Yttrium Oxide Substrate Surface After Standard and Preferred Cleaning Processes

| | Surface Concentration ($\times 10^{10}$ atoms/cm$^2$) | |
|---|---|---|
| Element | After Standard Cleaning | After Preferred Cleaning |
| Chromium (Cr) | <20 | <20 |
| Copper (Cu) | 350 | 600 |
| Iron (Fe) | <20 | 130 |
| Magnesium (Mg) | 140,000 | 17,000 |
| Manganese (Mn) | 120 | 48 |
| Titanium (Ti) | <20 | <20 |
| Zinc (Zn) | 2400 | 120 |

The surface concentrations of mobile elements magnesium, manganese, and zinc have been greatly reduced after cleaning using the multi-step process described above, in comparison with the "standard" cleaning process. This reduces the possibility that these mobile elements will travel to a workpiece surface during substrate processing.

In addition to removing impurities and contaminants from the yttrium oxide surface, the step of treating the yttrium oxide-comprising substrate with the dilute HF solution (for example, and without limitation, by soaking the substrate in or wiping the substrate with the dilute HF solution) provides fluorination (i.e., self-passivation) to the yttrium oxide surface. Fluorination of the yttrium oxide surface results in a robust, stable surface which is inert to reactive plasmas. Fluorination of the yttrium oxide surface can also be obtained by exposing the coated surface to a plasma containing fluorine species. Such a plasma may be generated from, for example and not by way of limitation, a plasma source gas such as $CF_4$ or $CHF_3/CF_4$. Typically, the plasma density is about $1 \times 10^9$ e$^-$/cm$^3$, under general processing conditions known in the art, which provide a yttrium oxide surface which is at least partially fluorinated.

If the gas distribution plate is used in a processing chamber which is not typically exposed to a fluorine-containing plasma, the gas distribution plate may periodically be removed from the chamber and re-fluorinated according to either the wet process or the plasma process described above. The re-fluorinated gas distribution plate is then re-inserted into the chamber for continued use.

Figure 3A:
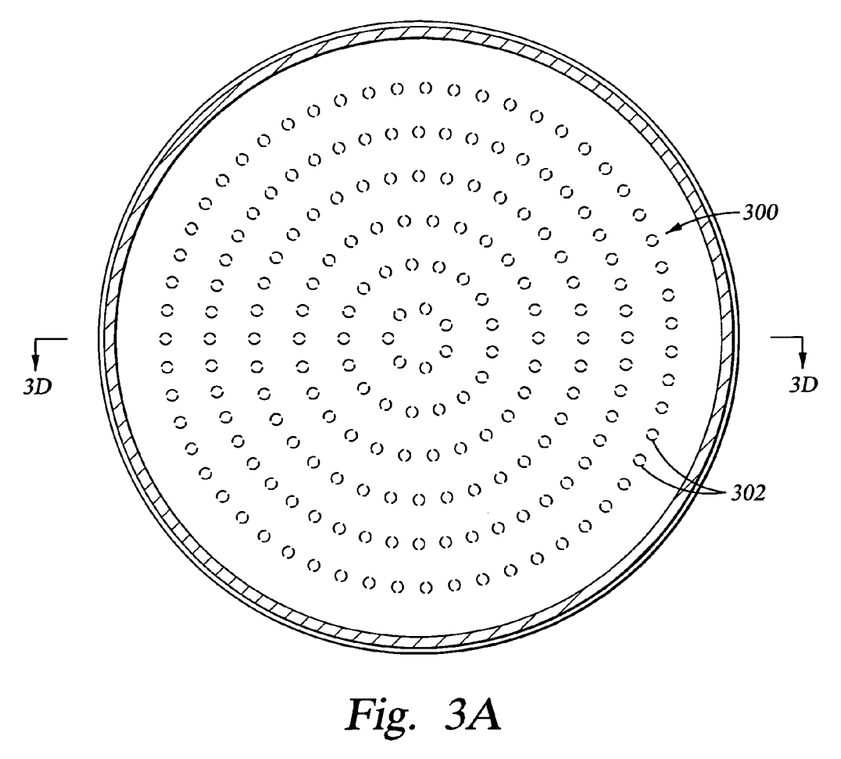
FIG. 3A shows a top view of an exemplary gas distribution plate 300 which has been fabricated from bulk yttrium oxide according to the present invention. The thickness of the gas distribution plate 300 typically ranges from about 0.100 inch to about 0.300 inch. The gas distribution plate 300 in this particular embodiment includes a total of 187 sets of crescent-shaped through-holes 302 which have been ultrasonically drilled in gas distribution plate 300.

FIG. 3A shows a top view of an exemplary gas distribution plate 300 which has been fabricated from bulk yttrium oxide according to the present invention. The thickness of the gas distribution plate 300 typically ranges from about 0.100 inch to about 0.300 inch. The gas distribution plate 300 in this particular embodiment includes a total of 374 individual crescent-shaped through-holes, which form 187 sets of crescent-shaped through-holes 302, which have been ultrasonically drilled in gas distribution plate 300.

Figure 3B:
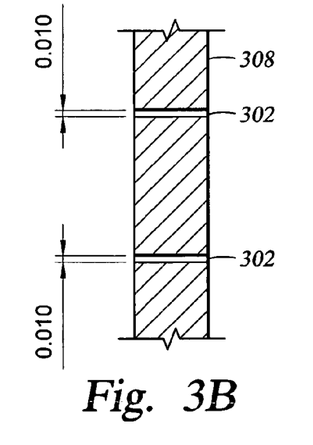
FIG. 3B shows a cross-sectional side view of one set of the through-holes 302 formed in the gas distribution plate 300 shown in FIG. 3A. The spacing between walls of the crescent is about 0.010 inch. The individual through-holes which make up set 302 are spaced approximately 0.800 inch apart from each other at the ends of the crescents.
Figure 3C:
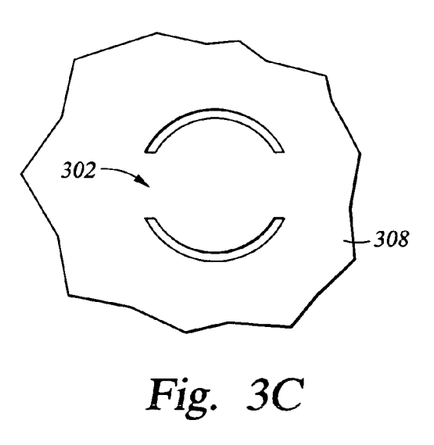
FIG. 3C shows an expanded top view of a set of through-holes 302 formed in the gas distribution plate 300 shown in FIG. 3A.

FIGS. 3B and 3C show, respectively, a cross-sectional side view (scale=10:1) and an expanded top view (scale=5:1), of one set of the through-holes 302 formed in the gas distribution plate 300 shown in FIG. 3A. The spacing between walls of the crescent is about 0.010 inch, as illustrated in FIG. 3B. The crescent-shaped through-holes in the sets of through-holes 302 are spaced approximately 0.800 inch apart from each other at the ends of the crescents.

Figure 3D:
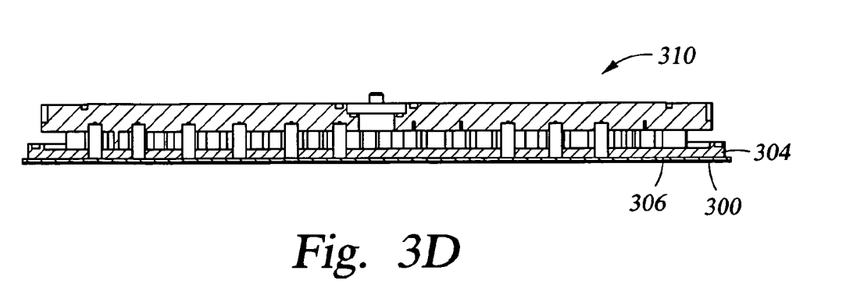
FIG. 3D shows a cross-sectional side view of one gas distribution assembly 310 in which a gas distribution plate fabricated from bulk yttrium oxide, such as that shown in FIG. 3A, can be employed. The gas distribution assembly 310 pictured in FIG. 3D is adapted for use in an Applied Materials' Producer™ etch chamber which is capable of processing 300-mm diameter substrates.
Figure 3E:
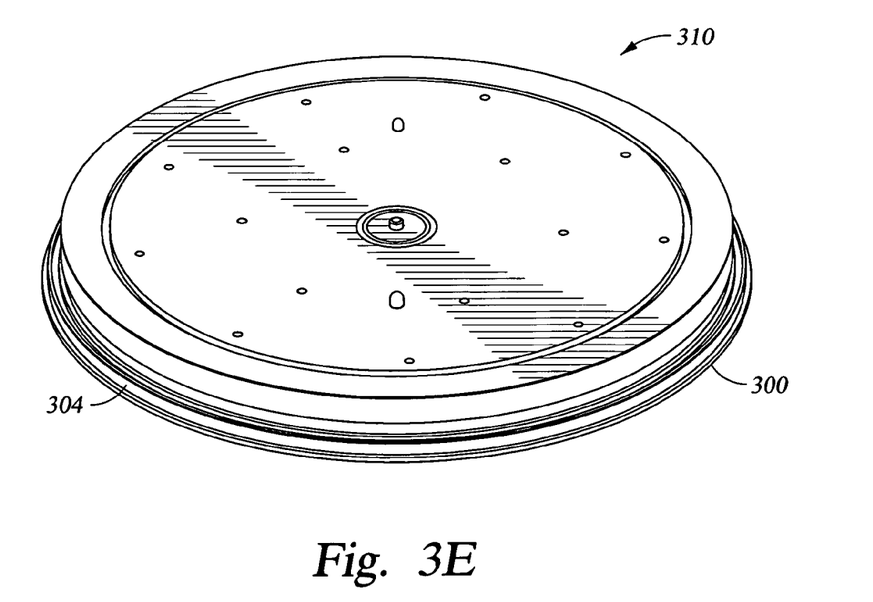
FIG. 3E shows a perspective view of the top of the gas distribution assembly 310 shown in FIG. 3D, which is attached to a gas supply apparatus (not shown).

Generally, a gas distribution plate 300 such as that shown in FIG. 3A is mounted in a gas distribution assembly 310, such as that illustrated in FIG. 3D. The gas distribution assembly 310 pictured in FIG. 3D is adapted for use in an Applied Materials' Producer™ etch chamber which is capable of processing 300-mm diameter substrates. FIG. 3E shows a perspective view of the top of the gas distribution assembly 310 shown in FIG. 3D, which is attached to a gas supply apparatus (not shown).

The gas distribution assembly 310 may includes (among other components which are adapted for delivery of processing gases to a processing chamber) an electrode 304 and a gas distribution plate 300 for delivering power and processing gases into a plasma processing chamber. Crescent-shaped through-holes are particularly preferred because they permit an increased gas flow without possibility of plasma ignition in the through-holes. As discussed above, through-holes can be formed in the gas distribution plate using laser drilling or ultrasonic drilling. Ultrasonic drilling provides excellent results when drilling crescent-shaped or other non-round through-holes. The spacing between walls of the crescent is large enough to permit gas flow, but too small to permit plasma ignition in the opening, and is typically less than about 0.020 inch; more typically, within the range of about 0.010 inch to about 0.015 inch. The use of crescent-shaped through-holes in a gas distribution plate for a gas distribution assembly is described, for example, in commonly owned, copending U.S. application Ser. No. 10/754,280, filed Jan. 8, 2004, of Daniel Hoffman et al., entitled "Plasma Reactor With Overhead RF Source Power Electrode with Low Loss, Low Arcing Tendency and Low Contamination" and commonly owned, copending U.S. application Ser. No. 10/772,787, filed Feb. 5, 2004, of Hamid Noorbakhsh et al., entitled "Gas Distribution Showerhead for Semiconductor Processing". The disclosures of U.S. application Ser. No. 10/754,280 and U.S. application Ser. No. 10/772,787 are hereby incorporated by reference in their entireties.

The electrode 304 is typically made of aluminum (for example, and not by way of limitation). The gas distribution plate 300 is typically bonded to the bottom surface of electrode 304 by means of a bonding layer 306, which may be, for example and not by way of limitation, a silicone-based adhesive with different types of fillers tailored for enhancing thermal conductivity. Filler types include Al, $Al_2O_3$, and boron nitride. The time period required for curing of the adhesive will typically range from about 1 hour to about 12 hours; more typically, from about 4 hours to about 12 hours. The curing time will depend on the particular adhesive used and its recommended curing temperature. (For example, a higher curing temperature will require a shorter curing time.) Suitable silicone-based adhesives are available, for example and not by way of limitation, from Dow Corning (Midland, Mich.); Rhone-Poulenc (France); and NuSil (Carpinteria, Calif.).

Bonding of gas distribution plate 300 to electrode 304 can be accomplished using other materials and/or methods known in the art. However, bonding of gas distribution plate 300 to electrode 304 should be performed using a bonding material which has enough compliance to prevent delamination due to thermal mismatch between the gas distribution plate 300 and the electrode 304.

Figure 4A:
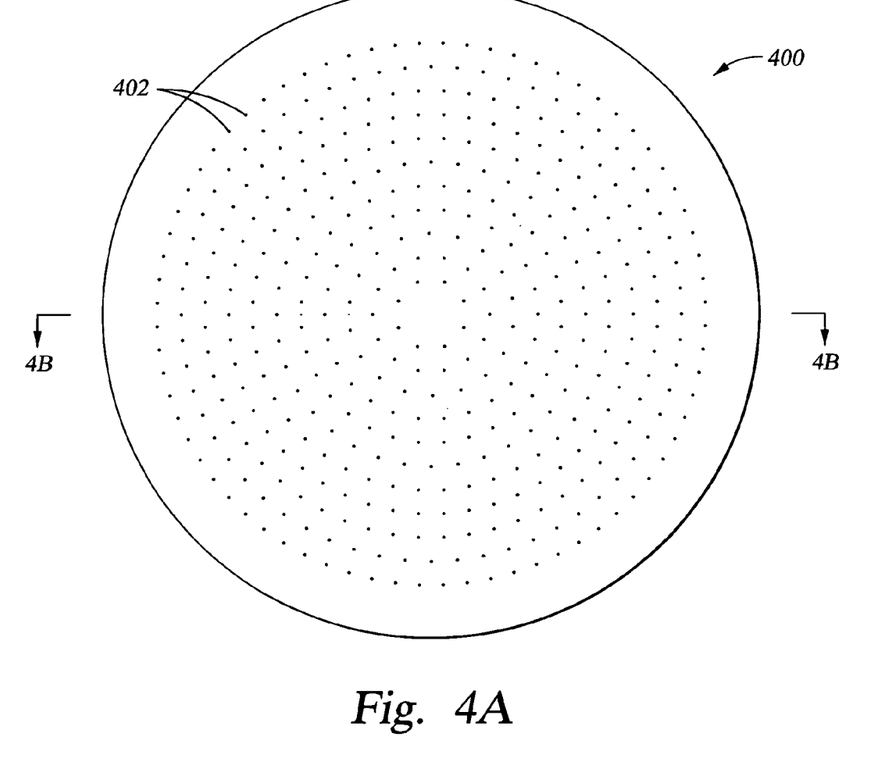
FIG. 4A shows a top view of an exemplary gas distribution plate 400 which has been fabricated from bulk yttrium oxide according to the present invention. The thickness of the gas distribution plate 400 typically ranges from about 0.100 inch to about 0.300 inch. The gas distribution plate 400 in this particular embodiment includes a plurality of round through-holes 402 which have been ultrasonically drilled in gas distribution plate 400. (For purposes of clarity, not all holes are shown.)

FIG. 4A shows a top view of an alternative embodiment exemplary gas distribution plate 400 which has been fabricated from bulk yttrium oxide according to the present invention. The thickness of the gas distribution plate 400 typically ranges from about 0.100 inch to about 0.300 inch. The gas distribution plate 400 includes a plurality of through-holes 402 which have been ultrasonically drilled in gas distribution plate 400. In this particular embodiment, the through-holes 402 are round. (For purposes of clarity, not all holes are shown.)

Figure 4B:
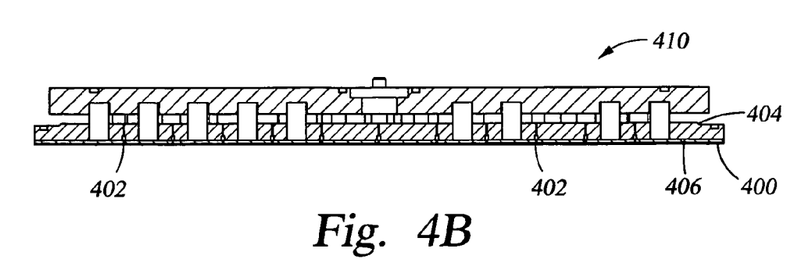
FIG. 4B shows a cross-sectional side view of one gas distribution assembly 410 in which a gas distribution plate fabricated from bulk yttrium oxide, such as that shown in FIG. 4A, can be employed. The gas distribution assembly 410 pictured in FIG. 4B is adapted for use in an Applied Materials' Producer™ etch chamber which is capable of processing 300-mm diameter substrates.
Figure 4C:
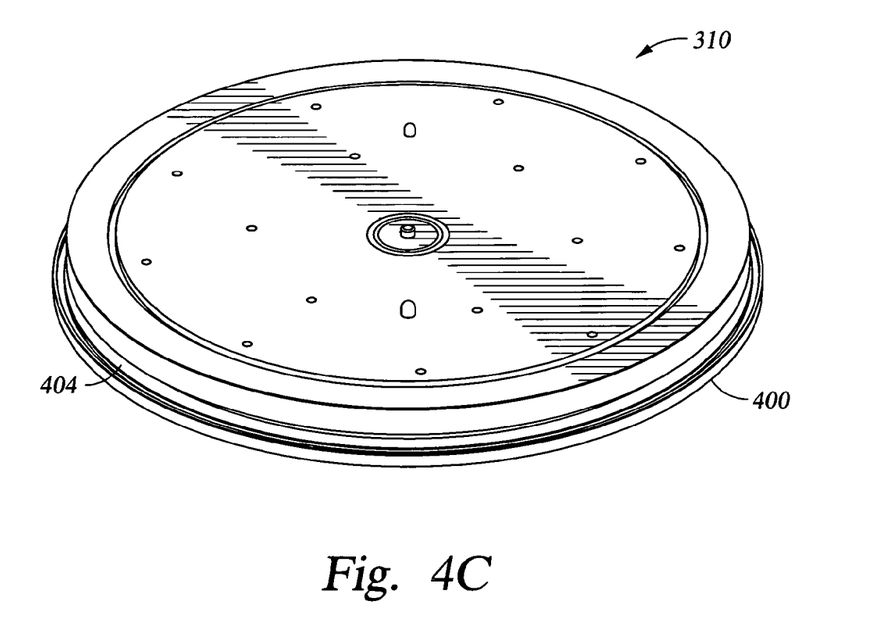
FIG. 4C shows a perspective view of the top of the gas distribution assembly 410 shown in FIG. 4B, which is attached to a gas supply apparatus (not shown).
Figure 4D:
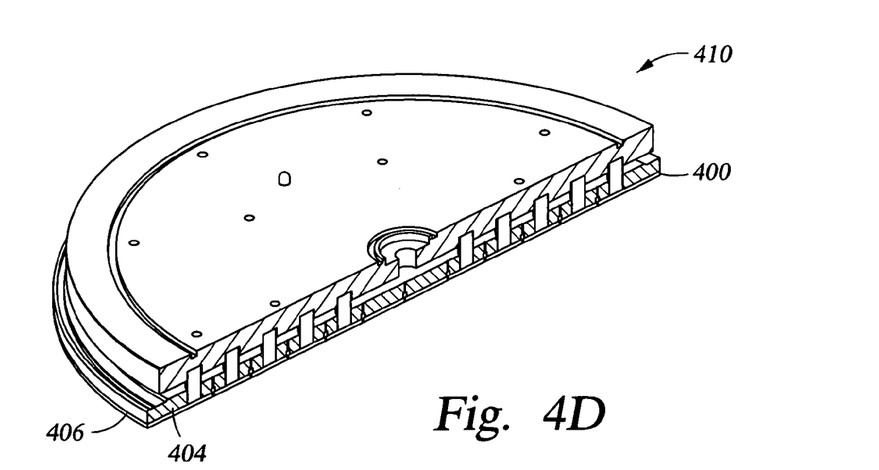
FIG. 4D shows a cross-sectional perspective view of the gas distribution assembly 410 shown in FIG. 4B.

Generally, a gas distribution plate such as that shown in FIG. 4A is mounted in a gas distribution assembly, such as that illustrated in FIG. 4B. The gas distribution assembly 410 pictured in FIG. 4B is adapted for use in an Applied Materials' Producer™ etch chamber which is capable of processing 300-mm diameter substrates. FIG. 4C shows a perspective view of the top of the gas distribution assembly 410 shown in FIG. 4B, which is attached to a gas supply apparatus (not shown). FIG. 4D shows a cross-section of the perspective view shown in FIG. 4C.

The gas distribution assembly 410 includes (among other components which are adapted for delivery of processing gases to a processing chamber) an electrode 404 and a gas distribution plate 400 which includes a plurality of round through-holes 402 for delivering processing gases into the processing chamber. As discussed above, through-holes can be formed in the gas distribution plate using laser drilling or ultrasonic drilling.

The electrode 404 is typically made of aluminum (for example, and not by way of limitation). The gas distribution plate 400 is typically bonded to the bottom surface of electrode 404 by means of a bonding layer 406. Bonding of gas distribution plate 400 to electrode 404 is typically accomplished using the types of materials and methods described above with respect to the gas distribution assembly 310 shown in FIGS. 3C through 3E.

The above described exemplary embodiments are not intended to limit the scope of the present invention, as one skilled in the art can, in view of the present disclosure expand such embodiments to correspond with the subject matter of the invention claimed below.

We claim:

1. A method of fabricating a gas distribution plate for use in a gas distribution assembly in a semiconductor processing chamber, said method comprising:
    a) selecting a substrate to be used to fabricate said gas distribution plate, wherein said substrate consists of yttrium oxide including from 0% up to about 10% by volume aluminum oxide;
    b) treating a surface of said substrate to fluoridate said surface;
    c) creating openings through said substrate, wherein said openings are created either before or after said treating of said substrate surface.

2. A method in accordance with claim 1, wherein a surface of said gas distribution plate is treated with fluorine species using a wet rub technique, whereby the surface characteristics of said substrate are improved with respect to mobile metal impurity content and the amount of loose particles present on said substrate surface.

3. A method in accordance with claim 1, wherein a plurality of through-holes are created in said substrate using ultrasonic drilling.

4. A method in accordance with claim 3, wherein said through-holes are crescent-shaped.

5. A method in accordance with claim 3, wherein, prior to said ultrasonic drilling, a layer of sacrificial material is applied over at least a portion of said substrate surface.

6. A method in accordance with claim 5, wherein said sacrificial material is a polymeric material.

7. A method in accordance with claim 5, wherein said sacrificial material is an inorganic material having a thermal coefficient of linear expansion which is similar to a thermal coefficient of linear expansion of said yttrium oxide.

8. A method in accordance with claim 6 or claim 7, wherein said sacrificial layer has a thickness within the range of about 4 mils to about 6 mils.

9. A method of fabricating a gas distribution plate for use in a gas distribution assembly in a semiconductor processing chamber, said method comprising:
    a) selecting a substrate to be used to fabricate said gas distribution plate, wherein said substrate consists of yttrium oxide including from 0% up to about 10% by volume aluminum oxide;
    b) treating a surface of said substrate to fluoridate said surface, wherein a said surface is treated with fluorine species, using a plasma having a density in the range of about $1\times10^9$ e$^-$/cm$^3$, whereby the surface characteristics of said substrate are improved with respect to mobile metal impurity content and the amount of loose particles present on said substrate surface; and
    c) creating openings through said substrate, wherein said openings are created either before or after said treating of said substrate surface.

10. A method in accordance with claim 9, wherein said fluorine-containing plasma is generated from a source gas comprising $CF_4$.

11. A method in accordance with claim 9, wherein a plurality of through-holes are created in said substrate using ultrasonic drilling.

12. A method in accordance with claim 11, wherein said through-holes are crescent-shaped.

13. A method in accordance with claim 11, wherein, prior to said ultrasonic drilling, a layer of sacrificial material is applied over at least a portion of said substrate surface.

14. A method in accordance with claim 13, wherein said sacrificial material is a polymeric material.

15. A method in accordance with claim 13, wherein said sacrificial material is an inorganic material having a thermal coefficient of linear expansion which is similar to a thermal coefficient of linear expansion of said yttrium oxide.

16. A method in accordance with claim 14 or claim 15, wherein said sacrificial layer has a thickness within the range of about 4 mils to about 6 mils.

* * * * *